US012743562B2

(12) United States Patent
Ye et al.

(10) Patent No.: US 12,743,562 B2
(45) Date of Patent: Sep. 22, 2026

(54) COLLABORATIVE RESILIENT GRID RESPONSE FRAMEWORK CONSIDERING DER UNCERTAINTIES AND DYNAMICS

(71) Applicant: Hitachi, Ltd., Tokyo (JP)

(72) Inventors: Yanzhu Ye, San Jose, CA (US); Bo Yang, Santa Clara, CA (US); Panitarn Chongfuangprinya, San Jose, CA (US); Masanori Abe, Mito (JP)

(73) Assignee: Hitachi Power Solutions Co., Ltd., Hitachi (JP)

( * ) Notice: Subject to any disclaimer, the term of this patent is extended or adjusted under 35 U.S.C. 154(b) by 993 days.

(21) Appl. No.: 17/981,241

(22) Filed: Nov. 4, 2022

(65) Prior Publication Data

US 2024/0160801 A1 May 16, 2024

(51) Int. Cl.
*G06F 30/18* (2020.01)
*G05B 13/02* (2006.01)
(Continued)

(52) U.S. Cl.
CPC ............ *G06F 30/18* (2020.01); *G06F 18/217* (2023.01); *G06F 30/27* (2020.01); *G06F 30/3308* (2020.01); *H02J 3/001* (2020.01); *G05B 13/0265* (2013.01); *G05B 13/04* (2013.01); *G05B 23/0283* (2013.01); *G06F 30/39* (2020.01); *G06N 3/006* (2013.01); *G06N 3/0442* (2023.01); *G06N 3/08* (2013.01);
(Continued)

(58) Field of Classification Search
CPC ....... G06Q 50/06; G06F 30/18; G06F 18/217; G06F 30/3308; G06F 30/39; G06F 30/27; H02J 3/001; H02J 13/00001; H02J 2300/24; H02J 2203/20; Y02E 40/30; G05B 13/04; G05B 13/0265; G05B 23/0283; Y04S 10/50; G06N 3/08; G06N 3/09; G06N 3/0442; G06N 20/00; G06N 3/006
USPC .......................................................... 307/80
See application file for complete search history.

(56) References Cited

U.S. PATENT DOCUMENTS

| | | | |
|---|---|---|---|
| 10,804,736 | B2 | 10/2020 | Sun et al. |
| 2021/0021130 | A1 | 1/2021 | Farrokhabadi et al. |

(Continued)

OTHER PUBLICATIONS

Donti et al., NPL ("Machine Learning for Sustainable Energy Systems" Published 2021 by www.annualreviews.org, 29 pages (Year: 2021).*

Zhao et al., NPL ("Learning Sequential Distribution System Restoration via Graph-Reinforcement Learning" Published 2021 by IEEE 11 pages (Year: 2021).*

*Primary Examiner* — Quoc A Tran
(74) *Attorney, Agent, or Firm* — PROCOPIO, CORY, HARGREAVES & SAVITCH LLP

(57) ABSTRACT

Systems and methods described herein can involve reducing a feeder system model by node cell segmentation on feeder system according to system topology information and system operation characteristics to generate a node cell segmented distribution grid; constructing observational data from systemwide status information aggregated from nodes identified from the node cell segmented distribution grid to meet a reinforcement learning (RL) policy network input requirement; training an RL policy framework to generate control actions for controllable components of the system; and executing the RL policy framework to generate control actions for controllable nodes in the node cell segmented distribution grid.

20 Claims, 8 Drawing Sheets

(51) Int. Cl.

| | |
|---|---|
| ***G05B 13/04*** | (2006.01) |
| ***G05B 23/02*** | (2006.01) |
| ***G06F 18/21*** | (2023.01) |
| ***G06F 30/27*** | (2020.01) |
| ***G06F 30/3308*** | (2020.01) |
| ***G06F 30/39*** | (2020.01) |
| ***G06N 3/006*** | (2023.01) |
| ***G06N 3/0442*** | (2023.01) |
| ***G06N 3/08*** | (2023.01) |
| ***G06N 3/09*** | (2023.01) |
| ***G06N 20/00*** | (2019.01) |
| ***G06Q 50/06*** | (2024.01) |
| ***H02J 3/001*** | (2026.01) |

(52) U.S. Cl.

CPC ............... *G06N 3/09* (2023.01); *G06N 20/00* (2019.01); *G06Q 50/06* (2013.01); *Y04S 10/50* (2013.01)

(56) References Cited

U.S. PATENT DOCUMENTS

| | | | | |
|---|---|---|---|---|
| 2021/0133376 | A1* | 5/2021 | Wang | G06F 30/27 |
| 2022/0014963 | A1* | 1/2022 | Yeh | H04W 28/0268 |
| 2022/0084139 | A1 | 3/2022 | Bhattarai et al. | |
| 2023/0093673 | A1* | 3/2023 | Narasimha Swamy | G06N 3/092<br>455/446 |

* cited by examiner

COLLABORATIVE RESILIENT GRID RESPONSE FRAMEWORK CONSIDERING DER UNCERTAINTIES AND DYNAMICS

BACKGROUND

Field

The present disclosure is generally directed to distributed energy resources (DER) systems, and more specifically, to a resilient grid response framework considering DER uncertainties and dynamics.

Related Art

Grid system resilience has been more critical for local distribution grid networks, due to the high level of dynamics and uncertainty brought by the increasing integration level of DERs (e.g. photovoltaic (PV), electric vehicles (EVs), energy storage systems, and so on) in the system. Distribution service restoration (DSR) is critical for improving the resilience and reliability of modern distribution systems by strategically and sequentially energizing the system components and customer loads during an outage. Conventional DSR approaches have their limitations in managing the dynamics/uncertainties from DERs (e.g. renewable generation, etc.) for optimal scheduling and control. The increasing system size with a large number of distributed energy sources also greatly increase the modelling complexity, and computational burden, which makes the prior of arts not feasible for the real-time application.

In the related art, there are model-based load restoration using DERs that can involve enhancing distribution system resiliency by using transactive mechanisms. Such a related art implementation can involve performing a transactive mechanism with one or more DERs in distribution, to provide incentives for non-utility DERs to adjust supply in order to reach a targeted voltage difference across terminals of switches. However, such related art implementations only focus on maintaining the voltage difference between two terminals of switches so that the switches can be controlled to network reconfiguration. System-wide co-ordination is still needed (e.g. the switch sequences). Further, the effectiveness of such related art methods greatly relies on the participation of DERs in the transactive energy system (e.g. self-responsive).

In the related art, there are methods and systems for post-disaster resilient restoration of a power distribution system, which can involve systems and methods for microgrid formulation to restore some power in a power distribution grid in response to a power disruption. However, such related art implementations involve centralized model-based optimization, which rely on the precise system models. Further, such related art implementations involve model non-linearity and uncertainty, and the computational speed and scalability are constrained by system size, especially due to the number of controllable devices and/or DERs in the system.

In the related art, there can also be other AI-based distribution service restoration involving systems and methods for distributed hierarchical artificial intelligence in smart grids. The related art implementation involves a hierarchical system architecture for distributed artificial intelligence (AI) control in smart grids. This related art architecture has two levels; at a higher level, the AI center module is located at the high-voltage transmission or distribution substation level, and manages a few points of aggregations. At a lower level, AI edge module is located on each aggregation points, which communicates with AI center module. Each AI edge module may cover controllable and non-controllable elements in distribution feeder, distribution transformer, or microgrid level, and so on. However, such related art implementations are a general hierarchical system architecture for distributed AI modules in smart grids, and does not provide any dedicated solution for distribution system service restoration.

SUMMARY

In general, a resilient power system is required to have the capability to withstand extreme events (e.g., hurricane, earthquake, etc.), and rapidly restore service for critical customers under impact. Distribution service restoration (DSR) is critical for improving the resilience and reliability of modern distribution systems by strategically and sequentially energizing the system components and customer loads. The example implementations described herein provide an effective resilience management system to fast restore system power supply at maximum level, and reduce the recovery time.

There exists a variety of challenges for an effective collaborative distribution system service restoration framework considering the trending of high penetration of distributed energy resources (e.g. PV, storages, EV, and so on) in the system, which includes, but is not limited to: management of dynamics/uncertainties from DERs (e.g. renewable generation, and so on) for optimal scheduling and control, coordination of a variety of parties in the distribution grid (e.g. EV aggregation, responsive load aggregation, distribution network operators, and so on), coordination of a variety of controllable entities for multi-step restoration process (e.g. behind-the-meter DER clusters, directly-controllable utility distributed generation, energy storage, photovoltaic, and so on), as well as high modeling/computational complexity due to increasing system size with a large number of integrated DERs.

Example implementations described herein involve a collaborative resilience grid response framework, which features with a reinforcement learning-based policy learning structure to optimally manage DER resources in the distribution grid for fast service restoration during an outage.

In example implementations, there is a hierarchical collaborative management framework, with features. In the framework, there can be a reinforcement learning (RL) policy learning structure as the core grid management methodology for grid service restoration, in which there can be flexible multi-agents placement for a variety of distribution system control entities. The action branching structure and extended network residual aggregation module enhances the coordination between a variety of DER components (e.g. behind-the-meter DER clusters (non-utility DERs), smart load clusters, and so on). Further, direct control of distributed generation (DG), photovoltaic (PV), and bulk electric system (BES) can be achieved through individual RL control agents.

In example implementations, there is an RL-based solution for fast decision making which can involve a flexible multi-agent reinforcement learning-based policy learning structure. The RL-based solution reduced the observation space and control action dimension in the policy learning structure through delicate system model reduction. The RL-based solution can involve a delicate system model reduction to reduce modelling complexity, which considers control integrity (e.g. behind-the-meter DER clusters, EV aggregations, and so on), autonomous microgrids, community division (e.g. islandable facility), topological segmentation, and so on. Further, DER dynamics and uncertainties can be considered through modelling DER operation flexibility range.

Aspects of the present disclosure can involve a method, which can include reducing a feeder system model by node cell segmentation on feeder system according to system topology information and system operation characteristics to generate a node cell segmented distribution grid; constructing observational data from systemwide status information aggregated from nodes identified from the node cell segmented distribution grid to meet a reinforcement learning (RL) policy network input requirement; training an RL policy framework to generate control actions for controllable components of the system to achieve acceptable system operation performance; and executing the RL policy framework to generate control actions for controllable nodes in the node cell segmented distribution grid.

Aspects of the present disclosure can involve a system, which can include means for reducing a feeder system model by node cell segmentation on feeder system according to system topology information and system operation characteristics to generate a node cell segmented distribution grid; means for constructing observational data from systemwide status information aggregated from nodes identified from the node cell segmented distribution grid to meet a reinforcement learning (RL) policy network input requirement; means for training an RL policy framework to generate control actions for controllable components of the system to achieve acceptable system operation performance; and means for executing the RL policy framework to generate control actions for controllable nodes in the node cell segmented distribution grid.

Aspects of the present disclosure can involve a computer program, which can include computer instructions involving reducing a feeder system model by node cell segmentation on feeder system according to system topology information and system operation characteristics to generate a node cell segmented distribution grid; constructing observational data from systemwide status information aggregated from nodes identified from the node cell segmented distribution grid to meet a reinforcement learning (RL) policy network input requirement; training an RL policy framework to generate control actions for controllable components of the system to achieve acceptable system operation performance; and executing the RL policy framework to generate control actions for controllable nodes in the node cell segmented distribution grid. The computer instructions and computer program can be stored in a non-transitory computer readable medium and executed by one or more processors.

Aspects of the present disclosure can involve an apparatus, which can include a processor, configured to reduce a feeder system model by node cell segmentation on feeder system according to system topology information and system operation characteristics to generate a node cell segmented distribution grid; construct observational data from systemwide status information aggregated from nodes identified from the node cell segmented distribution grid to meet a reinforcement learning (RL) policy network input requirement; train an RL policy framework to generate control actions for controllable components of the system to achieve acceptable system operation performance; and execute the RL policy framework to generate control actions for controllable nodes in the node cell segmented distribution grid.

DETAILED DESCRIPTION

Figure 1:
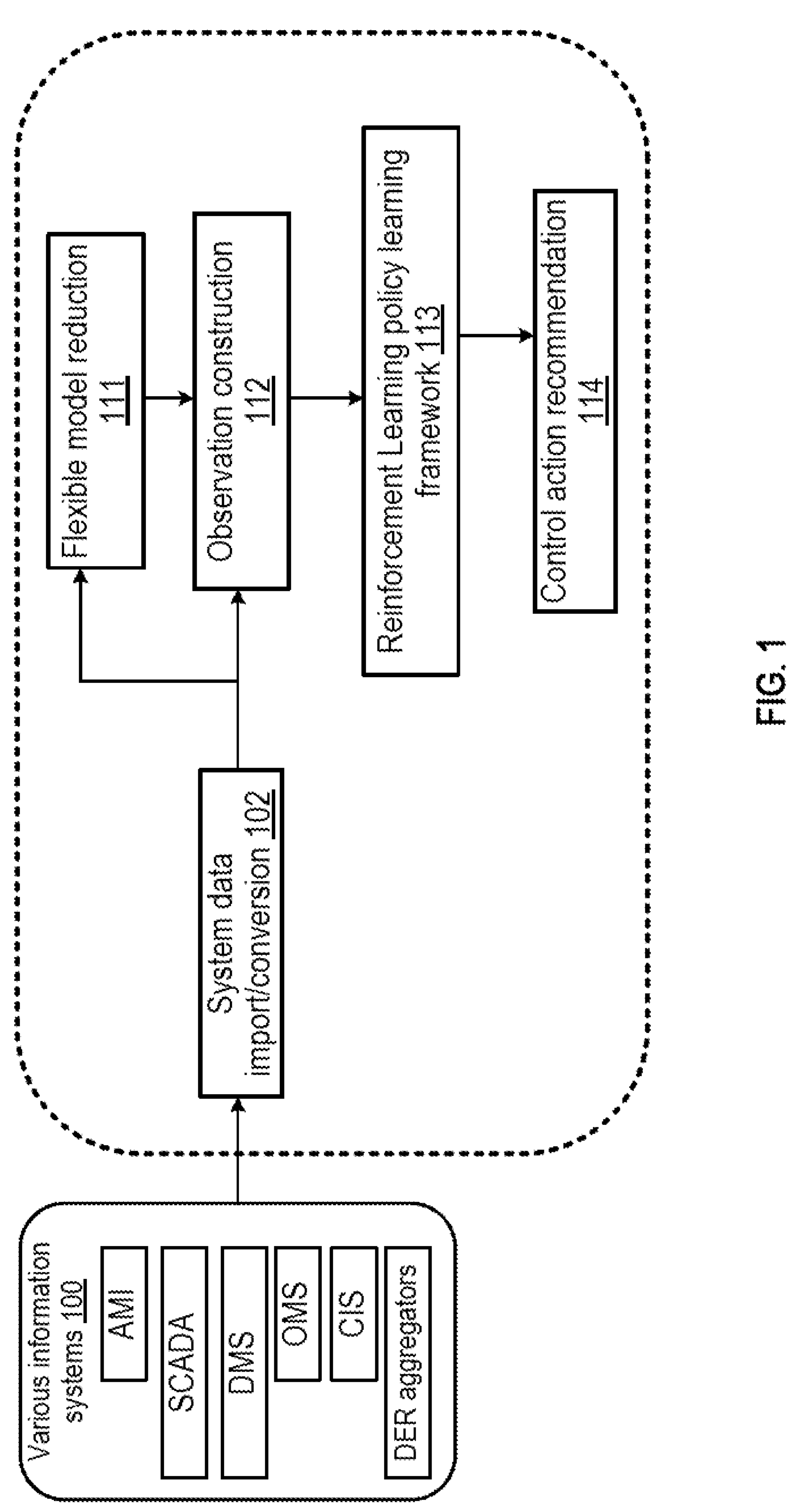
FIG. 1 illustrates a system diagram of the collaborative resilient grid response framework, in accordance with an example implementation.

The following detailed description provides details of the figures and example implementations of the present application. Reference numerals and descriptions of redundant elements between figures are omitted for clarity. Terms used throughout the description are provided as examples and are not intended to be limiting. For example, the use of the term "automatic" may involve fully automatic or semi-automatic implementations involving user or administrator control over certain aspects of the implementation, depending on the desired implementation of one of ordinary skill in the art practicing implementations of the present application. Selection can be conducted by a user through a user interface or other input means, or can be implemented through a desired algorithm. Example implementations as described herein can be utilized either singularly or in combination and the functionality of the example implementations can be implemented through any means according to the desired implementations.

Example implementations are directed to facilitating grid resilience of distribution system. In particular, example implementations described herein may be applied in response to a disruptive event such as a hurricane or an earthquake that cause system outages. The example implementations determine control actions to restore the grid system accordingly.

In example implementations, there are distribution systems that can involve a heterogenous mix of energy systems, such as photovoltaic systems, electric vehicles, and so on. In such a heterogenous environment, the power generation from those systems can depend on uncontrollable aspects such as the weather. Example implementations can also intake inputs to predict the outages of such systems with some certainty to provide effective restoration services as needed.

FIG. 1 illustrates a system diagram of the collaborative resilient grid response framework, in accordance with an example implementation. Example implementations described herein involve a collaborative resilient grid response for fast distribution grid service restoration. In the example implementations, various information systems 100 can provide grid or other energy related system data to the proposed system, which is received and processed by the system data import/conversion 102.

The system data import/conversion 102 provides the data to the flexible model reduction 111 and the observation construction 112, which are described in further detail below. The observation construction 112 is provided to the reinforcement learning policy learning framework 113 to train the RL policy network to generate control actions. The control action recommendation 114 is a set of controls for the corresponding grid or electric system to adjust the operation status of corresponding components in the grid.

Figure 2:
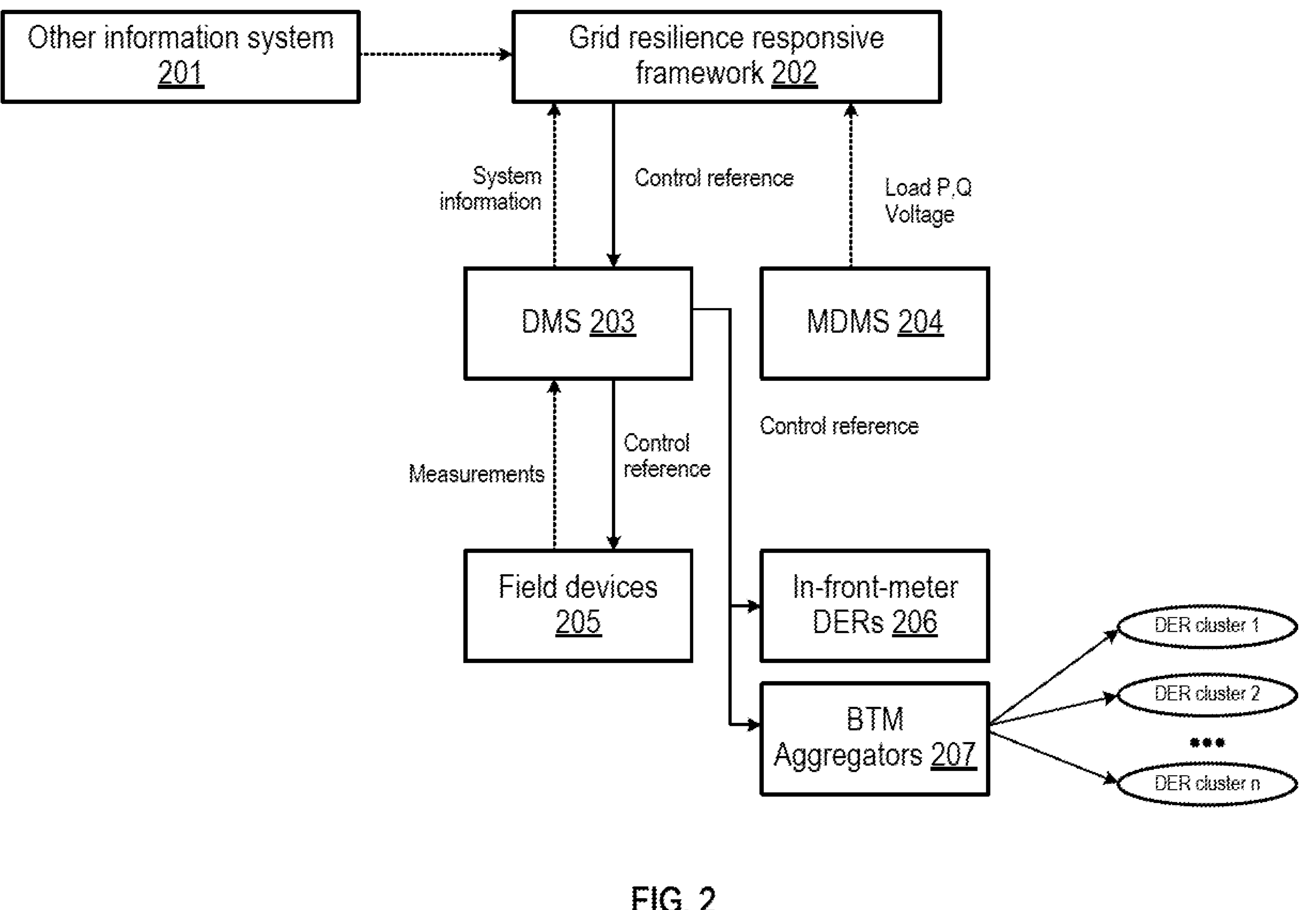
FIG. 2 illustrates potential system integration between grid resilience responsive framework and other utility systems, in accordance with an example implementation.

FIG. 2 illustrates potential system integration between grid resilience responsive framework and other utility systems, in accordance with an example implementation. This collaborative resilient grid response framework can be integrated as one functional part of distributed management systems (DMS) or developed as an individual module as an energy management solution for restoring grid service following interruptive events.

In example implementations, the other information systems 201 and well as systems such as distributed management systems (DMS) 203 and meter data management systems (MDMS) 204 can provide data to the grid resilience responsive framework 202 as illustrated in FIG. 1. Example data that can be provided can involve system information from the DMS or system loading measurement from MDMS 204. In response, the grid resilience responsive framework 202 can provide control actions/control reference to the DMS 203.

In example implementations, the DMS 203 manages various devices such as field devices 205, the in-front-meter DERs 206 and behind-the-meter aggregators 207. The behind-the-meter aggregators 207 can manage corresponding DER clusters depending on the desired implementation. Further, field devices 205 provide measurements to the DMS 203 which can be incorporated into the system information provided to the grid resilience responsive framework 202.

Based on the control reference/recommended control actions provided to the DMS 203, the DMS 203 can provide such actions to the field devices 205 to control them, as well as to the behind-the-meter aggregators 207 and in-front-meter DERs 206 to control their actions in accordance with the desired implementation. Further details are provided below, along with the key functional modules as illustrated in FIG. 1.

Flexible Model Reduction 111

The flexible model reduction module 111, which can also be referred as node cell segmentation, functions based on feeder system topology analysis. There are several categories of node cells as defined, to facilitate the following observation data structure 112 and RL-based policy learning framework 113. Such categories are as follows.

Type 1: electrical-formulated grid cell: In this type, the node cell is defined as a group of grid system components inter-connected by non-switchable lines (e.g. system load). These node cells are interconnected through switches.

Type 2: Autonomous Microgrid

Type 3: topologically-formulated community, which has one or two point of connection with main grid (e.g. hospital, factory, and so on).

Type 4: single-element node cell: This type is the minimal size of node cell, in which only one element is included (e.g. 1, one single utility-scale PV, utility-scale Energy storage system, and so on).

Figure 3:
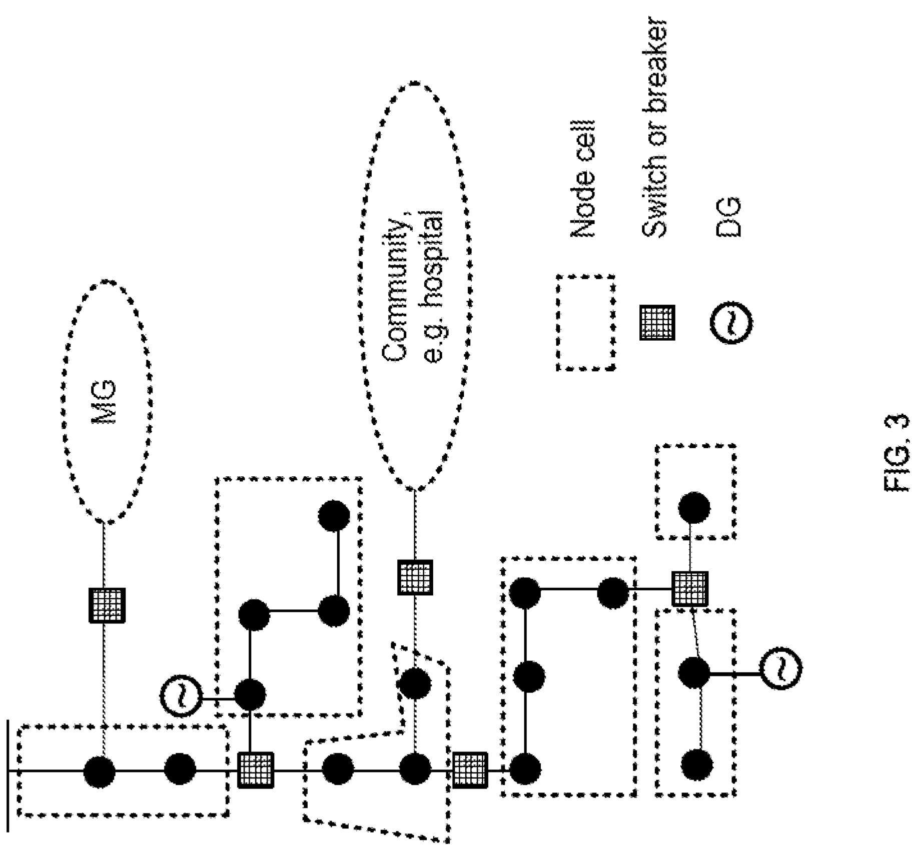
FIG. 3 illustrates an example of node cell segmentation in distribution grid, in accordance with an example implementation.

FIG. 3 illustrates an example of node cell segmentation in distribution grid, in accordance with an example implementation. The granularity level of node cell segmentation can be flexibly adjusted according to the control capabilities of distribution network operator (DNO). In this example, there are distribution grids (DG), node cells, switches/breakers and entities associated with the nodes such as a community (e.g., hospital) or a microgrid (MG).

Observation Data Construction

The observation data construction function 112 is mainly to integrate and consolidate measurement or system information from different data sources, and generate the observation spaces which fits the RL policy network input requirement 113.

Both the system observation space and reinforcement learning policy network is constructed based on the reduced network model as illustrated in FIG. 3.

Figure 4:
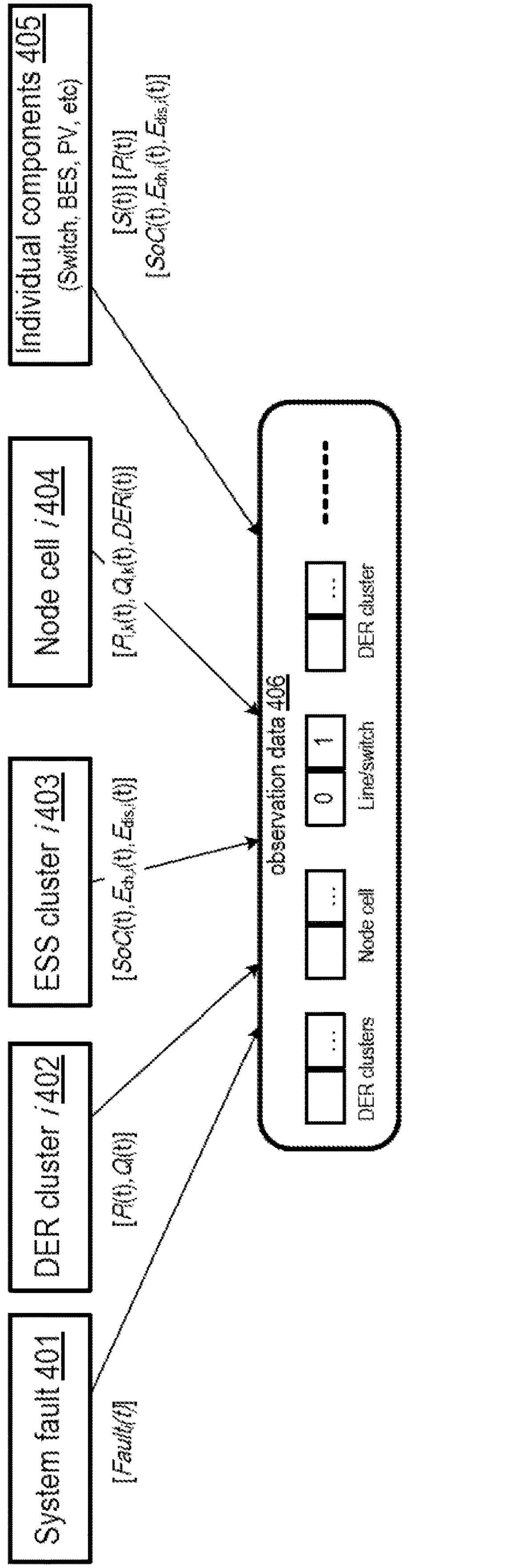
FIG. 4 illustrates observation data construction, in accordance with an example implementation.

FIG. 4 illustrates observation data construction, in accordance with an example implementation. The observation data construction mainly involves the following major components as illustrated in FIG. 4.

The observation construction is mainly to formulate the observation spaces based on which the RL policy network can generate the control action recommendation. The system observation can be formulated based on the reduced network model. In the example of FIG. 4, there can be system fault information 401 (e.g. fault location, and so on), DER/energy storage (ESS) cluster aggregation information 402, 403 (e.g. total active power, reactive power, and so on), node cell aggregation information 404, (e.g. load consumption under different priority level, DG operation flexibility, energization status, and so on), and individual components 405 (e.g., switch on/off status (0—off, 1—on)). Details are provided below.

System fault information 401:

The system fault information is tracked, e.g. $Fault_i(t)$ $Fault_i(t)$: the location of the i-th fault at time stamp t DER cluster aggregation information 402:

For the DER cluster, the total power consumptions (total active power, reactive power) is tracked, e.g. $[P_i(t),Q_i(t)]$ $P_i(t)$: the aggregated active power at time stamp t for ith DER cluster $Q_i(t)$: the aggregated reactive power at time stamp t for ith DER cluster The DER cluster can include but is not limited to demand responsive load clusters, aggregated PV clusters, and so on. This aggregation-level information for Behind-The-Meter (BTM) components can be aggregated and reported by aggregators, which has access and control capability over these BTM components.

Energy storage (ESS) clusters 403:

For distributed energy storage clusters, the tracked status includes: $[SoC_i(t),E_{ch,i}(t),E_{dis,i}(t)]$ Where $SoC_i(t)$: the state of charge status at time stamp t for i-th energy storage cluster $E_{ch,i}(t)$: the charging energy capability at time stamp t for i-th energy storage cluster $E_{dis,i}(t)$: the discharging energy capability at time stamp t for i-th energy storage cluster Node cell aggregation information 404:

For the pre-defined node cell i, the tracked status information includes: $[P_{i,k}(t),Q_{i,k}(t),DER_i(t)]$ $P_{i,k}(t)$: the aggregated active power requirement at k-th priority level at time stamp t in node cell i $Q_{i,k}(t)$: the aggregated reactive power requirement at k-th priority level at time stamp tin node cell i $DER_i(t)$: the DER generating power at time stamp t in node cell i, the DERs can refer to but are not limited to roof-top PVs, distributed DGs, etc.

Individual components/Directly-controllable devices 405:

The individual components/directly-controllable devices include, but are not limited to:

Switch/Breaker:

The tracked information includes:

$[S_i(t)]$

Where, $S_i(t)$: the status of the i-th switch/break at time stamp t, typically the status is on or off, which can be marked 0 or 1.

Utility-Scale PV:

The tracked information includes:

$[P_i(t)]$

Where $P_i(t)$: the power generation at time stamp t for i-th utility-scale PV

Utility-Scale Energy Storage System:

The tracked information includes:

$[SoC_i(t), E_{ch,i}(t), Edis,i(t)]$

Where $SoC_i(t)$: the state of charge status at time stamp t for i-th energy storage $E_{ch,i}(t)$: the charging energy capability at time stamp t for i-th energy storage $E_{dis,i}(t)$: the discharging energy capability at time stamp t for i-th energy storage The data from the major components can be processed as observation data 406 to include data from DER clusters, node sells, switches, and so on as illustrated in FIG. 4.

Reinforcement Learning Policy Learning Framework 113

The reinforcement learning (RL) already has proven its potential in solving complex sequential decision-making problems. In a general reinforcement learning setup, the Markov decision process (MDP) is adopted to formulate the decision-making problem, and this problem is then solved iteratively by reinforcement learning algorithms.

Figure 5:
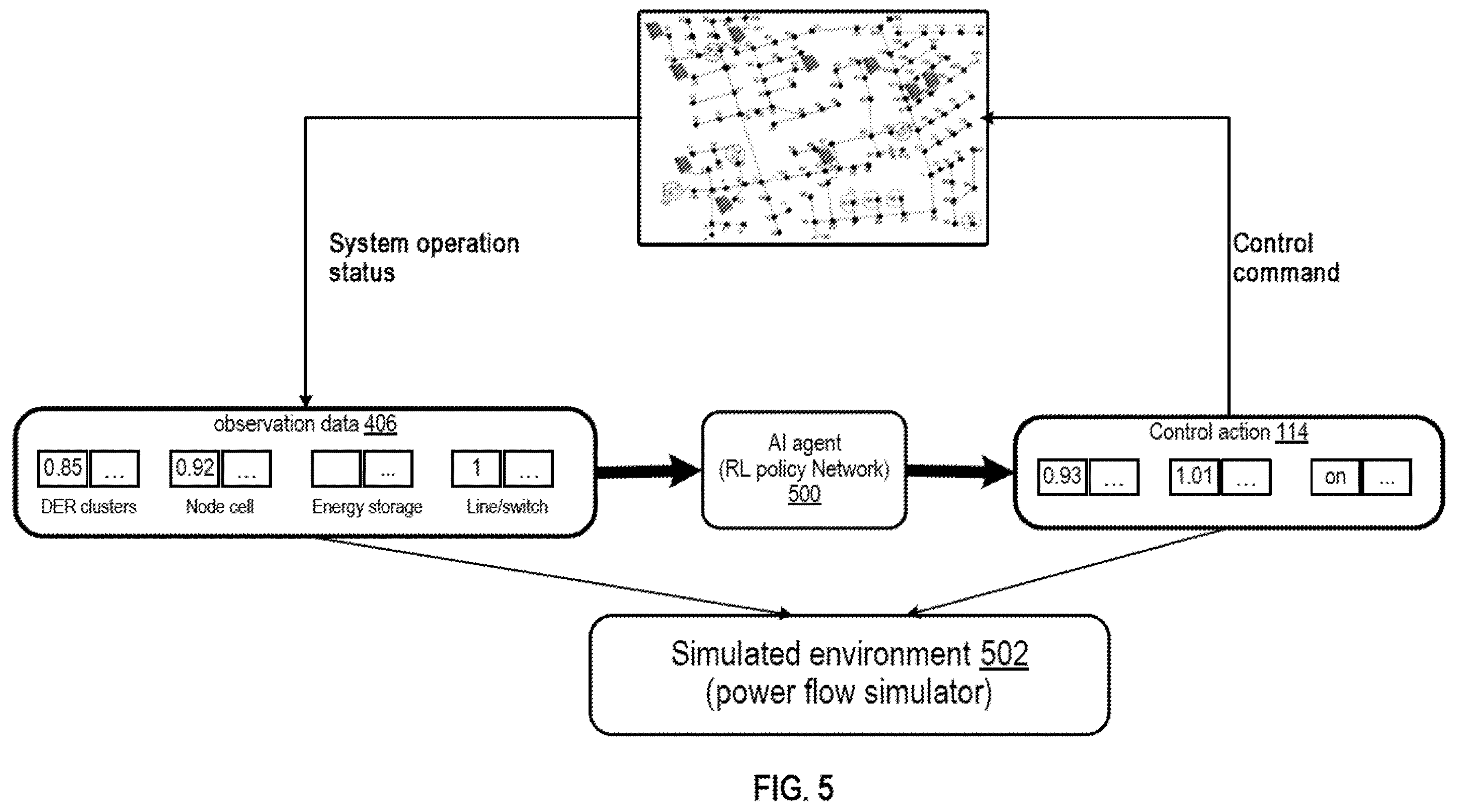
FIG. 5 illustrates the RL agents learning and interaction with a simulated environment or an actual system, in accordance with an example implementation.

FIG. 5 illustrates the RL agents learning and interaction with a simulated environment 502 or an actual system, in accordance with an example implementation. The RL agent is expected to be able to provide control actions according to a policy $\pi$ given an observation s, i.e. $a \sim \pi(\cdot|s)$. The goal is to maximize the restored grid service. As illustrated in the flow of FIG. 5, the observation data 406 is processed and provided to the AI agent 500 which implements the RL policy learning framework 113. The AI agent 500 is configured to generate control actions 114 for the information systems based on the policy network. The simulated environment, e.g. power flow simulator 502 can be configured to execute a power flow simulation based on the control actions input 114 during the RL training process. Further details of the RL policy network architecture are provided with respect to FIG. 6.

Figure 6:
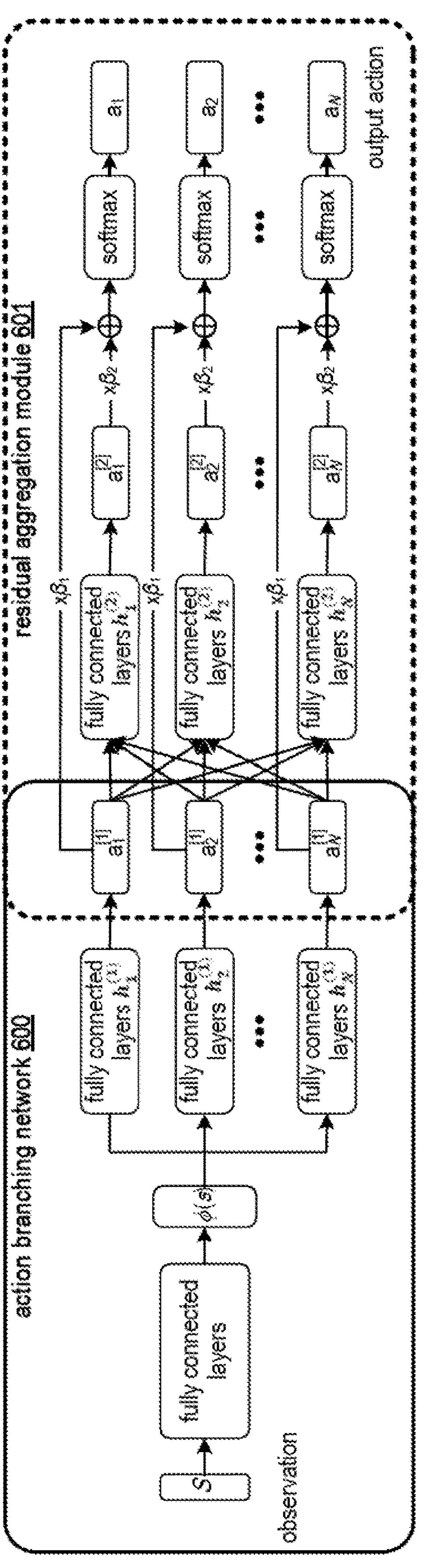
FIG. 6 illustrates an example architecture of RL policy network with a residual aggregation module, in accordance with an example implementation.

FIG. 6 illustrates an example architecture of RL policy network with a residual aggregation module, in accordance with an example implementation.

RL Problem Formulation:

In FIG. 6, the distribution grid service restoration is formatted as a RL problem, presented by these parameter sets $\langle N, S, A, R, f\rangle$. In which N is the number of control agents, S is the global observation space, $A=\{A_1, A_2, \ldots A_N\}$ is the set of action spaces for all agents. R is reward function, f represents the transition function.

The detailed illustration of these elements is as follows:

1) Observation S

The system observation $s \in S$ is available to all the agents, which is constructed based on the measurement or information of different components from various data sources as described with respect to observation data structure 112.

2) Actions a

Each agent in the system stands for an individual device or aggregation resources, which could be switches, large-scale energy storage system, utility-scale PVs, and so on, or clusters of BTM DERs, responsive load, distributed ESSs, and so on. Generally, each agent stands for each node cell, defined in flexible model reduction 111.

Depending on the type of entities the agent stands for, the action a, corresponding to the $i^{th}$ agent could have a different dimension, for example:

for ES unit, $a_i(t)=[c_i(t), d_i(t)]$, which represents the charging and discharging power;

for DG unit, $a_i(t)=[pi(t)]$, which represent the power dispatched from the i-th generator unit;

for the aggregation resources, $a_i(t)$ represents the aggregated set-points of these aggregation resources, the detailed control reference variables depend on the type of aggregation resources, e.g., for the aggregated distributed ESSs, $a_i(t)=[P_{i,dis}(t), P_{i,ch}(t)]$, representing the aggregated discharging and charging power, for the aggregated responsive loads, $a_i(t)=[P_i(t)]$, representing the aggregated load consumption.

The distributed system aggregator works as a second-tier control and will further generate the individual dispatching decisions for each individual distributed energy source to ensure satisfying the global system requirements.

3) Reward Function R

The reward function R is used for the RL algorithm to guide the action toward the maximum value. The algorithm aims to find the optimal action at the current state st so that the expected cumulative reward of future state is maximized. The reward function R should be designed as a good reflection of the control objectives. In example implementations described herein, the main control objective is to maximize the restored load. The following reward equation is designed to be equivalent to the control objectives.

$$R_t(s_t, a_t) = \sum_l \left| \sum_i w_{l,i}^2 P_{l,i}(t) \times \Delta t \right.$$

Where, l represent the node cell, i represent the i-th priority level, $w_{l,i}$, is the i-th load priority factor in node cell l, the value is between [0,1], the higher the factor is, the more critical the load is. $P_{l,i}(t)$ is the restored load demand at this i-th priority level in node cell l.

The reward function R can be adjusted to add more than one control objectives (e.g. adding the penalty for system operation limit violation) to formulate the problem as multi-objective. The system operation limit can include but are not limited to node voltage, line current, and so on in accordance with the desired implementation.

RL Policy Network Architecture

1) At the first level, as shown in FIG. 6, the policy network is built off of the action branching architecture, which features a shared decision module followed by several network branches, one for each sub-action {ai[1]}. The shared network module is used to compute a latent representation of the input states, then it is used to evaluate factorized (state-dependent) action advantages on the subsequent independent branches (hi[1])

2) At the second level, a residual aggregation module 601 is added following action branching architecture 600. The output of original action branching network output ai[1], followed by a subsequent branch hi2, which takes all or only a subset as input, output ai[2]. The residual aggregation module is mainly used to connect the previously generated vector ai[1] with ai[2], which incorporate the information from all the co-workers or a subset of the information.

Through the residual aggregation module, the sound communication across agents without losing the meaning of the readily generated decision of each individual agent can be achieved. At the last step, the ai[1] and ai[2] are added together, followed by a softmax layer to come up with eventual control action ai, (e.g. ai=softmax(β1ai[1]+β2ai[2]), where β1 and β2 are constant weights that control the relative dominance of ai[1] and ai[2])

3) At the output level, the control action generated through the softmax layer corresponds to each node cell defined in flexible model reduction 111. The node cell could present an individual device (switches, large-scale energy storage system, utility-scale PVs, etc.) or aggregation resources (e.g. a cluster of BTM DERs, responsive load, distributed ESSs, and so on)

The following equations summarizes the integrated policy network in in a more general form, which includes the residual aggregation module on top of an action branching network. K=2 is illustrated in FIG. 6.

$$a_i^{[1]} = h_i^{[1]}(\phi(s))$$

$$a_i^{[k]} = h_i^{[k]}\left(a_i^{[k-1]}, \ldots, a_N^{[k-1]}\right), k = 2, \ldots, K$$

$$a_i = \text{softmax}\left(\sum_k \beta_k a_i^{[k]}\right)$$

Through example implementations described herein, the collaborative resilient grid response framework introduced herein could be integrated as one functional module in DMS or developed as an individual energy management solution to support distribution network operators (DNOs) in system service restoration under extremely disruptive events (e.g. hurricane, earthquakes, and so on).

Example implementations described herein can well coordinate different controllable entities in the distribution grid, especially those DERs, to quickly support grid service restoration.

Further, example implementations perform better than model-based load restoration approaches with reduced modelling and computational complexity, more feasible for real-time operation.

In example implementations, the RL based approach can provide for fast computation time, which is more feasible for real-time control application. Further, the RL based approach can facilitate fewer requirements on detailed system models, and the coordination between different controllable entities can be achieved through a well-designed RL layer architecture. In addition, the techniques proposed herein can improve RL-based control performance, such as the convergence speed, and so on.

Figure 7:
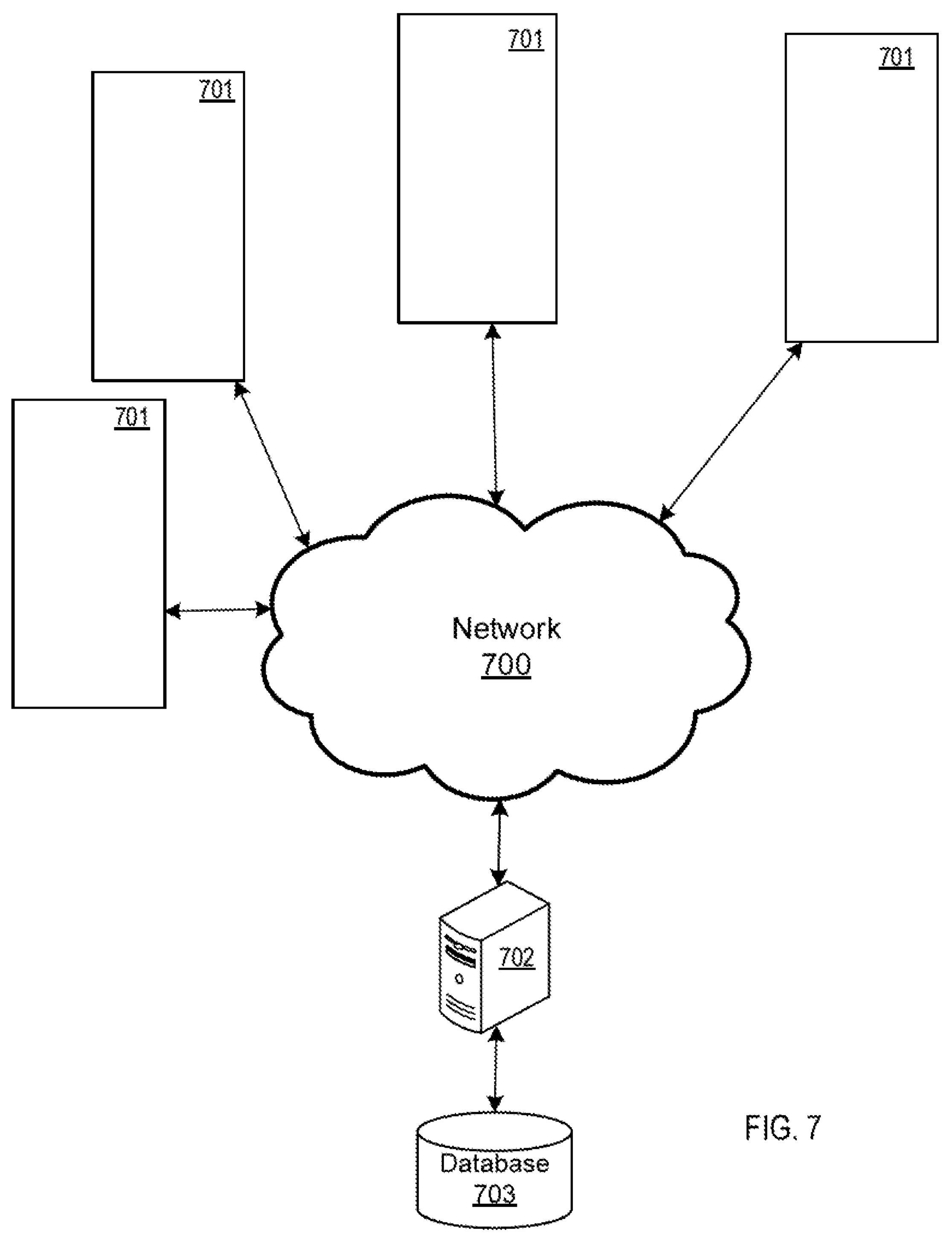
FIG. 7 illustrates a system involving a plurality of physical information systems networked to a management apparatus, in accordance with an example implementation.

FIG. 7 illustrates a system involving a plurality of physical information systems networked to a management apparatus, in accordance with an example implementation. One or more node cells systems integrated with various controllable nodes as described in FIG. 2 are communicatively coupled to a network 700 (e.g., local area network (LAN), wide area network (WAN)) through the corresponding network interface of the information systems 701, which is connected to a management apparatus 702. The management apparatus 702 manages a database 703, which contains historical data collected from the sensor systems from each of the information systems 701. In alternate example implementations, the data from the information systems 701 can be stored to a central repository or central database such as proprietary databases that intake data from the information systems 701, or systems such as enterprise resource planning systems, and the management apparatus 702 can access or retrieve the data from the central repository or central database. The information systems can involve any type of system as described herein, such as DMS, MDMS, and can manage field devices, DER clusters, and so on.

Figure 8:
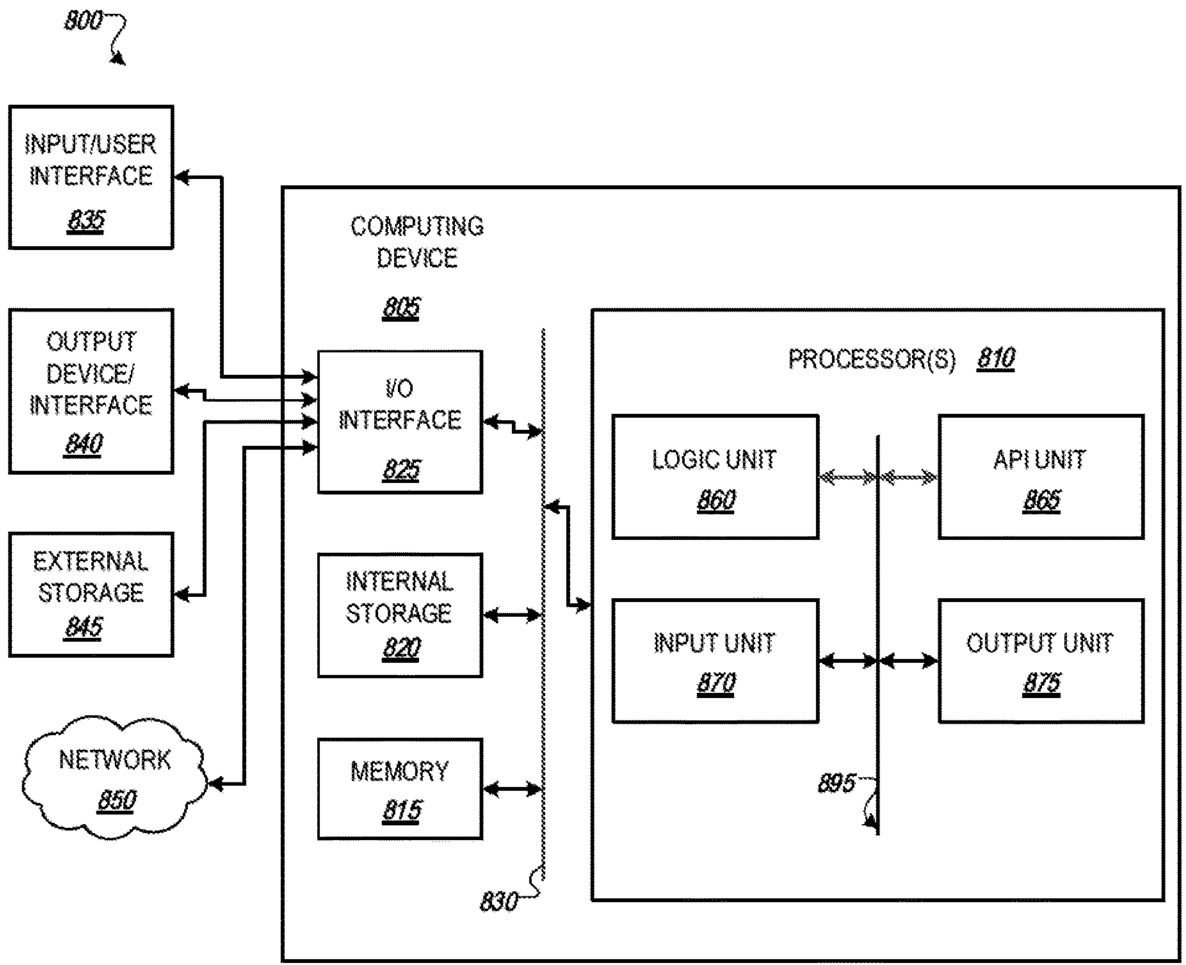
FIG. 8 illustrates an example computing environment with an example computer device suitable for use in some example implementations.

FIG. 8 illustrates an example computing environment with an example computer device suitable for use in some example implementations, such as a management apparatus 702 as illustrated in FIG. 7. Computer device 805 in computing environment 800 can include one or more processing units, cores, or processors 810, memory 815 (e.g., RAM, ROM, and/or the like), internal storage 820 (e.g., magnetic, optical, solid state storage, and/or organic), and/or I/O interface 825, any of which can be coupled on a communication mechanism or bus 830 for communicating information or embedded in the computer device 805. I/O interface 825 is also configured to receive images from cameras or provide images to projectors or displays, depending on the desired implementation.

Computer device 805 can be communicatively coupled to input/user interface 835 and output device/interface 840. Either one or both of input/user interface 835 and output device/interface 840 can be a wired or wireless interface and can be detachable. Input/user interface 835 may include any device, component, sensor, or interface, physical or virtual, that can be used to provide input (e.g., buttons, touch-screen interface, keyboard, a pointing/cursor control, microphone, camera, braille, motion sensor, optical reader, and/or the like). Output device/interface 840 may include a display, television, monitor, printer, speaker, braille, or the like. In some example implementations, input/user interface 835 and output device/interface 840 can be embedded with or physically coupled to the computer device 805. In other example implementations, other computer devices may function as or provide the functions of input/user interface 835 and output device/interface 840 for a computer device 805.

Examples of computer device 805 may include, but are not limited to, highly mobile devices (e.g., smartphones, devices in vehicles and other machines, devices carried by humans and animals, and the like), mobile devices (e.g., tablets, notebooks, laptops, personal computers, portable televisions, radios, and the like), and devices not designed for mobility (e.g., desktop computers, other computers, information kiosks, televisions with one or more processors embedded therein and/or coupled thereto, radios, and the like).

Computer device 805 can be communicatively coupled (e.g., via I/O interface 825) to external storage 845 and network 850 for communicating with any number of networked components, devices, and systems, including one or more computer devices of the same or different configuration. Computer device 805 or any connected computer device can be functioning as, providing services of, or referred to as a server, client, thin server, general machine, special-purpose machine, or another label.

I/O interface 825 can include, but is not limited to, wired and/or wireless interfaces using any communication or I/O protocols or standards (e.g., Ethernet, 802.11x, Universal System Bus, WiMax, modem, a cellular network protocol, and the like) for communicating information to and/or from at least all the connected components, devices, and network in computing environment 800. Network 850 can be any network or combination of networks (e.g., the Internet, local area network, wide area network, a telephonic network, a cellular network, satellite network, and the like).

Computer device 805 can use and/or communicate using computer-usable or computer-readable media, including transitory media and non-transitory media. Transitory media include transmission media (e.g., metal cables, fiber optics), signals, carrier waves, and the like. Non-transitory media include magnetic media (e.g., disks and tapes), optical media (e.g., CD ROM, digital video disks, Blu-ray disks), solid state media (e.g., RAM, ROM, flash memory, solid-state storage), and other non-volatile storage or memory.

Computer device 805 can be used to implement techniques, methods, applications, processes, or computer-executable instructions in some example computing environments. Computer-executable instructions can be retrieved from transitory media, and stored on and retrieved from non-transitory media. The executable instructions can originate from one or more of any programming, scripting, and machine languages (e.g., C, C++, C#, Java, Visual Basic, Python, Perl, JavaScript, and others).

Processor(s) 810 can execute under any operating system (OS) (not shown), in a native or virtual environment. One or more applications can be deployed that include logic unit 860, application programming interface (API) unit 865, input unit 870, output unit 875, and inter-unit communication mechanism 895 for the different units to communicate with each other, with the OS, and with other applications (not shown). The described units and elements can be varied in design, function, configuration, or implementation and are not limited to the descriptions provided. Processor(s) 810 can be in the form of hardware processors such as central processing units (CPUs) or in a combination of hardware and software units.

In some example implementations, when information or an execution instruction is received by API unit 865, it may be communicated to one or more other units (e.g., logic unit 860, input unit 870, output unit 875). In some instances, logic unit 860 may be configured to control the information flow among the units and direct the services provided by API unit 865, input unit 870, output unit 875, in some example implementations described above. For example, the flow of one or more processes or implementations may be controlled by logic unit 860 alone or in conjunction with API unit 865. The input unit 870 may be configured to obtain input for the calculations described in the example implementations, and the output unit 875 may be configured to provide output based on the calculations described in example implementations.

Processor(s) 810 can be configured to execute a method or instructions involving reducing a feeder system model by node cell segmentation on feeder system according to system topology information and system operation characteristics to generate a node cell segmented distribution grid (e.g., by executing flexible model reduction 111 and as shown in FIGS. 1 to 3); constructing observational data 406 from systemwide status information (e.g., 112, FIG. 4) aggregated from nodes identified from the node cell segmented distribution grid (FIG. 3) to meet a reinforcement learning (RL) policy network input requirement; training an RL policy framework to generate control actions for controllable components of the system to achieve acceptable system operation performance as shown at 113; and executing the RL policy framework to generate control actions for controllable nodes in the node cell segmented distribution grid as shown at 114.

Depending on the desired implementation, the nodes can involve one or more of an electrical-formulated grid cell, autonomous microgrid, topologically-formulated community, or single-element node-cell as described with respect to flexible model reduction 111.

Processor(s) 810 can be configured to execute the method or instructions described above, wherein the reducing the feeder system model by node cell segmentation involves grouping system components according to the plurality of node cell types as shown in FIG. 3 and as described with respect to flexible model reduction 1111. For example, as illustrated in FIG. 3, node cell segmentation can involve grouping inter-connected nodes by non-switchable lines in the feeder system topology, by autonomous formulated microgrid, and so on.

Depending on the desired implementation, the observational data is constructed from system fault information 401, distributed energy resource (DER) cluster aggregation information 402, 043, node cell aggregation information 404, and directly-controllable components status as aggregated from the systemwide status information 406 as illustrated in FIG. 4.

Processor(s) 810 can be configured to execute a method or instructions as described above, wherein the training the RL policy framework involves generating, from input of the systemwide status information 406, the control actions 114 for the controllable nodes in the node cell segmented distribution grid; executing a power flow simulation 502 based on the control actions input and the systemwide status information; generating a reward or penalty for the RL policy framework based on output from the power flow simulation; and updating the RL policy framework based on the corresponding reward or penalty as described in FIG. 5.

Depending on the desired implementation, the RL policy framework is deployed on a distribution management system (DMS) or an energy management application configured to restore grid service of a managed grid in response to an interruptive event as illustrated in FIG. 2. In the architecture of FIG. 2, a resilient grid response framework can be integrated as part of DMS or developed as an individual energy management application for restoring grid service in response to an interruptive event.

Some portions of the detailed description are presented in terms of algorithms and symbolic representations of operations within a computer. These algorithmic descriptions and symbolic representations are the means used by those skilled in the data processing arts to convey the essence of their innovations to others skilled in the art. An algorithm is a series of defined steps leading to a desired end state or result. In example implementations, the steps carried out require physical manipulations of tangible quantities for achieving a tangible result.

Unless specifically stated otherwise, as apparent from the discussion, it is appreciated that throughout the description, discussions utilizing terms such as “processing,” “computing,” “calculating,” “determining,” “displaying,” or the like, can include the actions and processes of a computer system or other information processing device that manipulates and transforms data represented as physical (electronic) quantities within the computer system's registers and memories into other data similarly represented as physical quantities within the computer system's memories or registers or other information storage, transmission or display devices.

Example implementations may also relate to an apparatus for performing the operations herein. This apparatus may be specially constructed for the required purposes, or it may include one or more general-purpose computers selectively activated or reconfigured by one or more computer programs. Such computer programs may be stored in a computer readable medium, such as a computer-readable storage medium or a computer-readable signal medium. A computer-readable storage medium may involve tangible mediums such as, but not limited to optical disks, magnetic disks, read-only memories, random access memories, solid state devices and drives, or any other types of tangible or non-transitory media suitable for storing electronic information. A computer readable signal medium may include mediums such as carrier waves. The algorithms and displays presented herein are not inherently related to any particular computer or other apparatus. Computer programs can involve pure software implementations that involve instructions that perform the operations of the desired implementation.

Various general-purpose systems may be used with programs and modules in accordance with the examples herein, or it may prove convenient to construct a more specialized apparatus to perform desired method steps. In addition, the example implementations are not described with reference to any particular programming language. It will be appreciated that a variety of programming languages may be used to implement the techniques of the example implementations as described herein. The instructions of the programming language(s) may be executed by one or more processing devices, e.g., central processing units (CPUs), processors, or controllers.

As is known in the art, the operations described above can be performed by hardware, software, or some combination of software and hardware. Various aspects of the example implementations may be implemented using circuits and logic devices (hardware), while other aspects may be implemented using instructions stored on a machine-readable medium (software), which if executed by a processor, would cause the processor to perform a method to carry out implementations of the present application. Further, some example implementations of the present application may be performed solely in hardware, whereas other example implementations may be performed solely in software. Moreover, the various functions described can be performed in a single unit, or can be spread across a number of components in any number of ways. When performed by software, the methods may be executed by a processor, such as a general-purpose computer, based on instructions stored on a computer-readable medium. If desired, the instructions can be stored on the medium in a compressed and/or encrypted format.

Moreover, other implementations of the present application will be apparent to those skilled in the art from consideration of the specification and practice of the techniques of the present application. Various aspects and/or components of the described example implementations may be used singly or in any combination. It is intended that the specification and example implementations be considered as examples only, with the true scope and spirit of the present application being indicated by the following claims.

What is claimed is:

1. A method for distribution grid service restoration in response to a disruptive event, the method comprising:
   - reducing a feeder system model by node cell segmentation on feeder system according to system topology information and system operation characteristics to generate a node cell segmented distribution grid;
   - constructing observational data from systemwide status information aggregated from nodes identified from the node cell segmented distribution grid to meet a reinforcement learning (RL) policy network input requirement;
   - training an RL policy framework to generate control actions for controllable components of the system;
   - executing the RL policy framework to generate control actions for controllable nodes in the node cell segmented distribution grid; and
   - transmitting the control actions to controllable components in the distribution grid to restore grid service by energizing system components and customer loads.

2. The method of claim 1, wherein the nodes comprise one or more of an electrical-formulated grid cell, autonomous microgrid, topologically-formulated community, or single-element node-cell.

3. The method of claim 1, wherein the reducing the feeder system model by node cell segmentation comprises grouping system components according to a plurality of node cell types.

4. The method of claim 1, wherein the observational data is constructed from system fault information, distributed energy resource (DER) cluster aggregation information, node cell aggregation information, and directly-controllable components status as aggregated from the systemwide status information.

5. The method of claim 1, wherein the training the RL policy framework comprises:
   - generating, from input of the systemwide status information, the control actions for the controllable nodes in the node cell segmented distribution grid;
   - executing a power flow simulation based on the control actions input and the systemwide status information;
   - generating a reward or penalty for the RL policy framework based on output from the power flow simulation; and
   - updating the RL policy framework based on a corresponding reward or penalty.

6. The method of claim 1, wherein the RL policy framework is deployed on a distribution management system (DMS) or an energy management application configured to restore grid service of a managed grid in response to an interruptive event.

7. The method of claim 1, wherein the transmitting the control actions comprises providing the control actions to a distribution management system (DMS), and
   - wherein the DMS controls field devices, in-front-meter distributed energy resources (DERs), and behind-the-meter aggregators in the distribution grid based on the control actions.

8. The method of claim 1, wherein the disruptive event comprises a hurricane or earthquake causing system outages, and wherein the control actions coordinate distributed energy resources (DERs) comprising one or more of photovoltaic systems, energy storage systems, or distributed generators to restore power supply to critical customers.

9. A non-transitory computer readable medium, storing instructions for executing a process for distribution grid service restoration in response to a disruptive event, the instructions comprising:
   - reducing a feeder system model by node cell segmentation on feeder system according to system topology information and system operation characteristics to generate a node cell segmented distribution grid;
   - constructing observational data from systemwide status information aggregated from nodes identified from the node cell segmented distribution grid to meet a reinforcement learning (RL) policy network input requirement;

training an RL policy framework to generate control actions for controllable components of the system;

executing the RL policy framework to generate control actions for controllable nodes in the node cell segmented distribution grid; and transmitting the control actions to controllable components in the distribution grid to restore grid service by energizing system components and customer loads.

10. The non-transitory computer readable medium of claim 9, wherein the nodes comprise one or more of an electrical-formulated grid cell, autonomous microgrid, topologically-formulated community, or single-element node-cell.

11. The non-transitory computer readable medium of claim 9, wherein the reducing the feeder system model by node cell segmentation comprises grouping system components according to a plurality of node cell types.

12. The non-transitory computer readable medium of claim 9, wherein the observational data is constructed from system fault information, distributed energy resource (DER) cluster aggregation information, node cell aggregation information, and directly-controllable components status as aggregated from the systemwide status information.

13. The non-transitory computer readable medium of claim 9, wherein the training the RL policy framework comprises:

generating, from input of the systemwide status information, the control actions for the controllable nodes in the node cell segmented distribution grid;

executing a power flow simulation based on the control actions input and the systemwide status information;

generating a reward or penalty for the RL policy framework based on output from the power flow simulation; and updating the RL policy framework based on a corresponding reward or penalty.

14. The non-transitory computer readable medium of claim 9, wherein the RL policy framework is deployed on a distribution management system (DMS) or an energy management application configured to restore grid service of a managed grid in response to an interruptive event.

15. An apparatus for distribution grid service restoration in response to a disruptive event, the apparatus comprising:

a processor, configured to:

reduce a feeder system model by node cell segmentation on feeder system according to system topology information and system operation characteristics to generate a node cell segmented distribution grid;

construct observational data from systemwide status information aggregated from nodes identified from the node cell segmented distribution grid to meet a reinforcement learning (RL) policy network input requirement;

train an RL policy framework to generate control actions for controllable components of the system;

execute the RL policy framework to generate control actions for controllable nodes in the node cell segmented distribution grid; and transmit the control actions to controllable components in the distribution grid to restore grid service by energizing system components and customer loads.

16. The apparatus of claim 15, wherein the nodes comprise one or more of an electrical-formulated grid cell, autonomous microgrid, topologically-formulated community, or single-element node-cell.

17. The apparatus of claim 15, wherein the processor is configured to reduce the feeder system model by node cell segmentation by grouping system components according to a plurality of node cell types.

18. The apparatus of claim 15, wherein the observational data is constructed from system fault information, distributed energy resource (DER) cluster aggregation information, node cell aggregation information, and directly-controllable components status as aggregated from the systemwide status information.

19. The apparatus of claim 15, wherein the processor is configured to train the RL policy framework by:

generating, from input of the systemwide status information, the control actions for the controllable nodes in the node cell segmented distribution grid;

executing a power flow simulation based on the control actions input and the systemwide status information;

generating a reward or penalty for the RL policy framework based on output from the power flow simulation; and updating the RL policy framework based on a corresponding reward or penalty.

20. The apparatus of claim 15, wherein the RL policy framework is deployed on a distribution management system (DMS) or an energy management application configured to restore grid service of a managed grid in response to an interruptive event.

* * * * *